(12) United States Patent
Jin et al.

(10) Patent No.: US 9,656,912 B2
(45) Date of Patent: May 23, 2017

(54) METAL NANOWIRES FILM

(71) Applicants: Tsinghua University, Beijing (CN);
HON HAI PRECISION INDUSTRY CO., LTD., New Taipei (TW)

(72) Inventors: Yuan-Hao Jin, Beijing (CN);
Qun-Qing Li, Beijing (CN);
Shou-Shan Fan, Beijing (CN)

(73) Assignees: Tsinghua University, Beijing (CN);
HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/967,348

(22) Filed: Dec. 13, 2015

(65) Prior Publication Data
US 2016/0345434 A1    Nov. 24, 2016

(30) Foreign Application Priority Data

May 21, 2015 (CN) .......................... 2015 1 0263855

(51) Int. Cl.
| | | |
|---|---|---|
| *H05K 1/00* | (2006.01) | |
| *C03C 17/09* | (2006.01) | |
| *C23C 14/20* | (2006.01) | |
| *C23C 14/58* | (2006.01) | |
| *C23C 16/06* | (2006.01) | |
| *C23C 16/56* | (2006.01) | |
| *C23C 30/00* | (2006.01) | |
| *C23F 4/00* | (2006.01) | |

(Continued)

(52) U.S. Cl.
CPC .............. *C03C 17/09* (2013.01); *C23C 14/20* (2013.01); *C23C 14/5826* (2013.01); *C23C 14/5873* (2013.01); *C23C 16/06* (2013.01); *C23C 16/56* (2013.01); *C23C 30/00* (2013.01); *C23F 4/00* (2013.01); *G06F 3/044* (2013.01); *G06F 3/047* (2013.01); *H05K 1/028* (2013.01); *H05K 1/03* (2013.01); *H05K 1/09* (2013.01); *C03C 2217/252* (2013.01); *C03C 2217/253* (2013.01); *C03C 2217/255* (2013.01); *C03C 2218/33* (2013.01); *C03C 2218/34* (2013.01); *G06F 2203/04103* (2013.01); *G06F 2203/04112* (2013.01); *H05K 2201/0323* (2013.01); *H05K 2201/0364* (2013.01)

(58) Field of Classification Search
CPC .. H05K 1/097; H05K 2201/026; B82Y 30/00; B82Y 40/00; H01L 21/02603
See application file for complete search history.

(56) References Cited

U.S. PATENT DOCUMENTS

2009/0321113 A1* 12/2009 Allemand ............. B22F 1/0022
174/257
2010/0051320 A1*  3/2010 Hong ..................... B82Y 10/00
174/250

(Continued)

*Primary Examiner* — Steven T Sawyer
(74) *Attorney, Agent, or Firm* — Steven Reiss

(57) ABSTRACT

The disclosure relates to a metal nanowire film. The metal nanowire film includes a substrate and a number of first metal nanowire bundles located on the substrate. The number of first metal nanowire bundles are parallel with and spaced from each other. Each of the number of first metal nanowire bundles includes a number of first metal nanowires parallel with each other. The first distance between adjacent two of the number of first metal nanowires is less than the second distance between adjacent two of the number of first metal nanowire bundles.

9 Claims, 16 Drawing Sheets

(51) Int. Cl.
*G06F 3/044* (2006.01)
*G06F 3/047* (2006.01)
*H05K 1/02* (2006.01)
*H05K 1/03* (2006.01)
*H05K 1/09* (2006.01)

(56) References Cited

U.S. PATENT DOCUMENTS

2011/0053794 A1\* 3/2011 Zhang .................. B01J 19/0046
  506/9
2011/0064785 A1\* 3/2011 Daniels .............. A61B 17/0057
  424/443
2011/0274882 A1\* 11/2011 Wallace .............. B81C 1/00031
  428/166
2013/0146335 A1\* 6/2013 Gambino ............ H01L 31/1884
  174/251
2013/0242485 A1\* 9/2013 Ohtani .................... G06F 3/041
  361/679.01
2014/0285736 A1\* 9/2014 Choi ...................... B82Y 30/00
  349/12

\* cited by examiner

METAL NANOWIRES FILM

CROSS-REFERENCE TO RELATED APPLICATIONS

This application claims all benefits accruing under 35 U.S.C. §119 from China Patent Application No. 201510263855.8, filed on May 21, 2015, in the China Intellectual Property Office, disclosure of which is incorporated herein by reference.

FIELD

The subject matter herein generally relates to nano materials and methods for making the same, in particular, to metal nanowire films and methods for making the same based on carbon nanotubes.

BACKGROUND

Transparent conductive film is attracting more and more attention in electronic device field because of widely application.

The transparent conductive film includes indium tin oxide (ITO) layer, carbon nano tube (CNT) film, or metal mesh. Usually, the method for making metal mesh is chemical etching which is complicated. The line width of the metal mesh is usually about tens of micrometers due to the process limitation. When the metal mesh is used in small size electronic device, such as mobile phone or tablet computer, the metal wires of the metal mesh are visible to the naked eye.

What is needed, therefore, is to provide a metal nanowire film for solving the problem discussed above.

BRIEF DESCRIPTION OF THE DRAWINGS

Implementations of the present technology will now be described, by way of example only, with reference to the attached figures, wherein.

DETAILED DESCRIPTION

Figure 1:
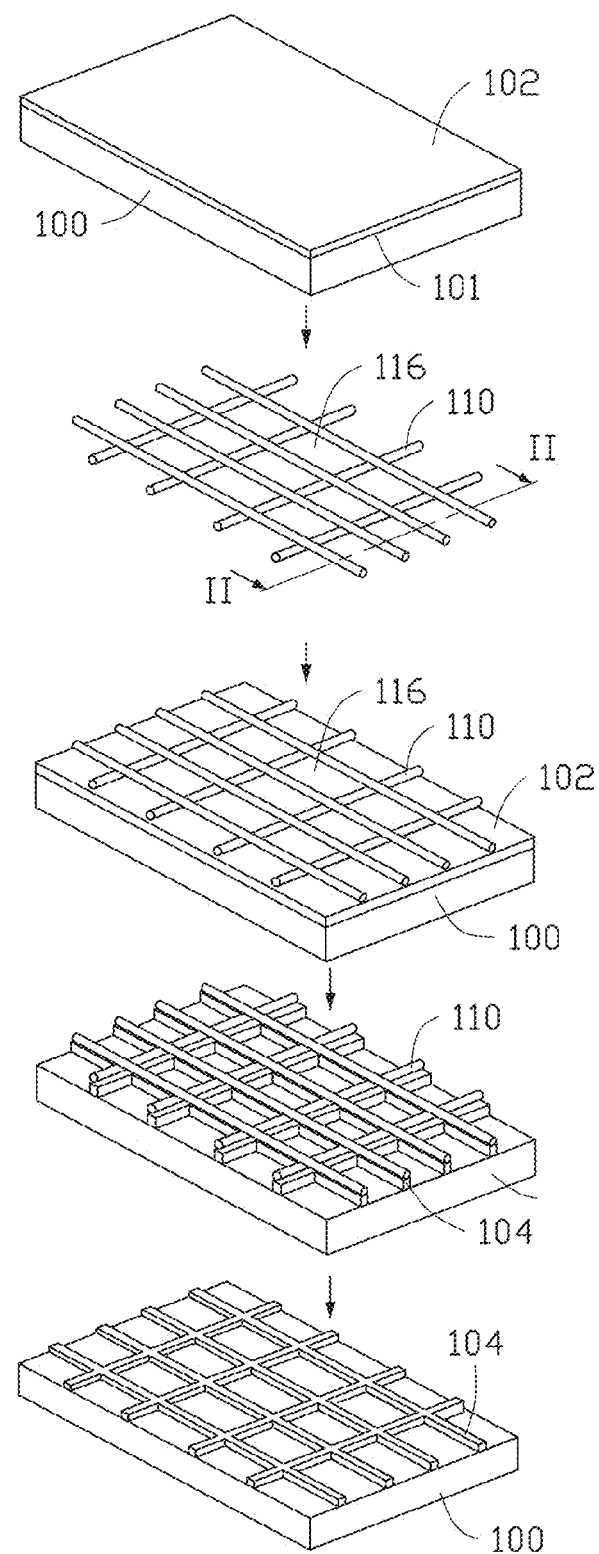
FIG. 1 is a flowchart of one embodiment of a method for making a metal nanowire film on a surface of a substrate of one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present metal nanowire films and methods making the same based on carbon nanotubes.

Figure 2:
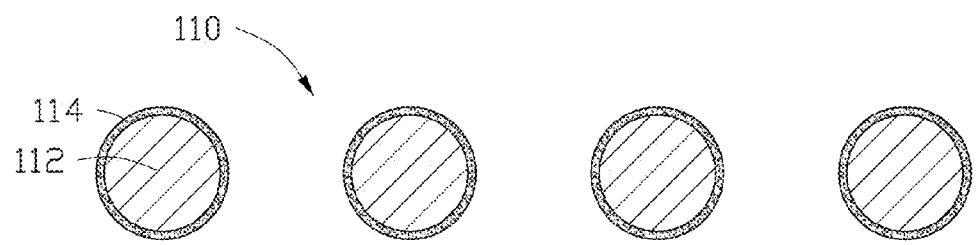
FIG. 2 is a cross-sectional view along line II-II of FIG. 1.

Referring to FIGS. 1-2, a method for making a metal nanowire film 104 of one embodiment includes the following steps:

step (S10), applying a metal layer 102 on a surface 101 of a substrate 100;

step (S11), providing a carbon nanotube composite structure 110, wherein the carbon nanotube composite structure 110 defines a plurality of openings 116 and includes a carbon nanotube structure 112 and a protective layer 114 coated on the carbon nanotube structure 112, and the carbon nanotube structure 112 includes a plurality of carbon nanotubes arranged substantially along the same direction;

step (S12), placing the carbon nanotube composite structure 110 on a surface of the metal layer 102, wherein parts of the metal layer 102 are exposed by the plurality of openings 116;

step (S13), forming the metal nanowire film 104 on the substrate 100 by dry etching the metal layer 102 using the carbon nanotube composite structure 110 as a mask; and step (S14), removing the carbon nanotube composite structure 110.

In step (S10), the substrate 100 can be a curved or planar sheet configured to support metal nanowire film 104. The substrate 100 can be transparent or opaque. The substrate 100 can be flexible or rigid. The substrate 100 can be made of rigid materials such as silicon wafer, ceramic, glass, quartz, diamond, metal oxide, plastic or any other suitable material. The substrate 100 can be made of flexible materials such as polycarbonate (PC), polymethyl methacrylate acrylic (PMMA), polyethylene terephthalate (PET), polyether polysulfones (PES), polyvinyl polychloride (PVC), benzocyclobutenes (BCB), polyesters, polyimide (PI), polyethylene (PE), acrylonitrile-butadiene-styrene copolymer (ABS), polyamide (PA), polybutylene terephthalate (PBT), acrylic resins, or mixture thereof. The mixture can be PC/ABS, PC/PBT, PC/PET, or PC/PMMA. The substrate 100 can also be a printed-wiring board (PWB). The light transmittance of the substrate 100 can be greater than 75%, such as greater than 90%. In one embodiment, the substrate 100 is a planar glass plate.

The material of the metal layer 102 is not limited and can be gold, silver, copper, iron, aluminum, nickel or chromium. The metal layer 102 can be applied on the substrate 100 by a deposition method such as electron beam evaporation, magnetron sputtering or atomic layer deposition. The metal layer 102 can be patterned by dry etching. The thickness of the metal layer 102 can be less than 100 nanometers, such as less than 50 nanometers. In one embodiment, the metal layer 102 is a gold film with a thickness of 10 nanometers and coated on entire surface 101 of the substrate 100.

In step (S11), the carbon nanotube structure 112 is a free-standing structure. The term "free-standing structure" includes that the carbon nanotube structure 112 can sustain the weight of itself when it is hoisted by a portion thereof without any significant damage to its structural integrity. Thus, the carbon nanotube structure 112 can be suspended by two spaced supports.

The plurality of carbon nanotubes can be single-walled carbon nanotubes, double-walled carbon nanotubes, or multi-walled carbon nanotubes. The length and diameter of the plurality of carbon nanotubes can be selected according to need. The diameter of the single-walled carbon nanotubes can be in a range from about 0.5 nanometers to about 10 nanometers. The diameter of the double-walled carbon nanotubes can be in a range from about 1.0 nanometer to about 15 nanometers. The diameter of the multi-walled carbon nanotubes can be in a range from about 1.5 nanometers to about 50 nanometers. In one embodiment, the length of the carbon nanotubes can be in a range from about 200 micrometers to about 900 micrometers.

The plurality of carbon nanotubes are orderly arranged to form an ordered carbon nanotube structure. The plurality of carbon nanotubes extend along a direction substantially parallel to the surface of the carbon nanotube structure 112. The term 'ordered carbon nanotube structure' includes, but is not limited to, a structure wherein the plurality of carbon nanotubes are arranged in a consistently systematic manner, e.g., the plurality of carbon nanotubes are arranged approximately along the same direction.

The carbon nanotube structure 112 defines a plurality of apertures. The aperture extends throughout the carbon nanotube structure 112 along the thickness direction thereof. The aperture can be a hole defined by several adjacent carbon nanotubes, or a gap defined by two substantially parallel carbon nanotubes and extending along axial direction of the carbon nanotubes. The hole shaped aperture and the gap shaped aperture can exist in the carbon nanotube structure 112 at the same time. Hereafter, the size of the aperture is the diameter of the hole or width of the gap. The sizes of the apertures can be different. The average size of the apertures can be in a range from about 10 nanometers to about 500 micrometers. For example, the sizes of the apertures can be about 50 nanometers, 100 nanometers, 500 nanometers, 1 micrometer, 10 micrometers, 80 micrometers, or 120 micrometers.

The carbon nanotube structure 112 can include at least one carbon nanotube film, at least one carbon nanotube wire, or combination thereof. In one embodiment, the carbon nanotube structure 112 can include a single carbon nanotube film or two or more carbon nanotube films stacked together. Thus, the thickness of the carbon nanotube structure 112 can be controlled by the number of the stacked carbon nanotube films. The number of the stacked carbon nanotube films can be in a range from about 2 to about 100. For example, the number of the stacked carbon nanotube films can be 10, 30, or 50. In one embodiment, the carbon nanotube structure 112 is formed by folding a single carbon nanotube wire. In one embodiment, the carbon nanotube structure 112 can include a layer of parallel and spaced carbon nanotube wires. Also, the carbon nanotube structure 112 can include a plurality of carbon nanotube wires crossed or weaved together to form a carbon nanotube net. The distance between two adjacent parallel and spaced carbon nanotube wires can be in a range from about 0.1 micrometers to about 200 micrometers. In one embodiment, the distance between two adjacent parallel and spaced carbon nanotube wires is in a range from about 10 micrometers to about 100 micrometers. The gap between two adjacent substantially parallel carbon nanotube wires is defined as the apertures. The size of the apertures can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 3:
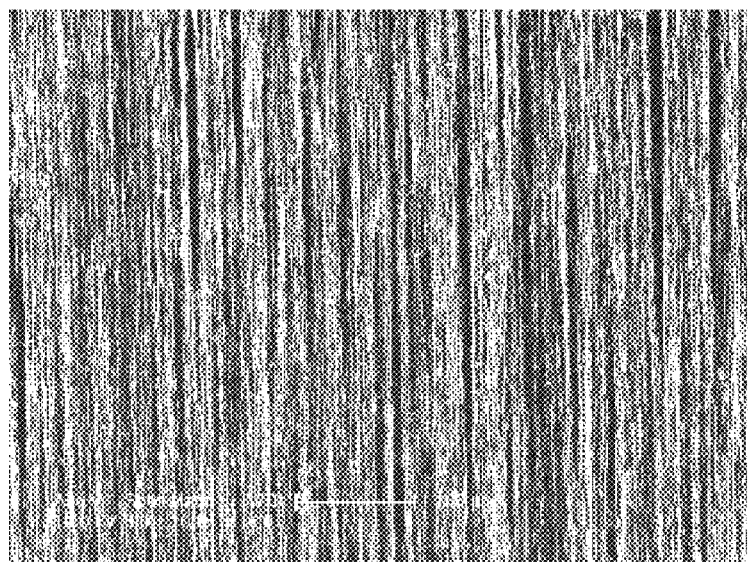
FIG. 3 is a Scanning Electron Microscope (SEM) image of a drawn carbon nanotube film of one embodiment.

In one embodiment, the carbon nanotube structure 112 includes at least one drawn carbon nanotube film. The drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIG. 3, each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. As can be seen in FIG. 3, some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film defines a plurality of apertures between adjacent carbon nanotubes.

The carbon nanotube structure 112 can include at least two stacked drawn carbon nanotube films. In other embodiments, the carbon nanotube structure 112 can include two or more coplanar carbon nanotube films, and can include layers of coplanar carbon nanotube films. Additionally, when the carbon nanotubes in the drawn carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube structure 112. In one embodiment, the carbon nanotube structure 112 has the aligned directions of the carbon nanotubes between adjacent stacked drawn carbon nanotube films at 90 degrees. Stacking the carbon nanotube films will also add to the structural integrity of the carbon nanotube structure 112.

Figure 4:
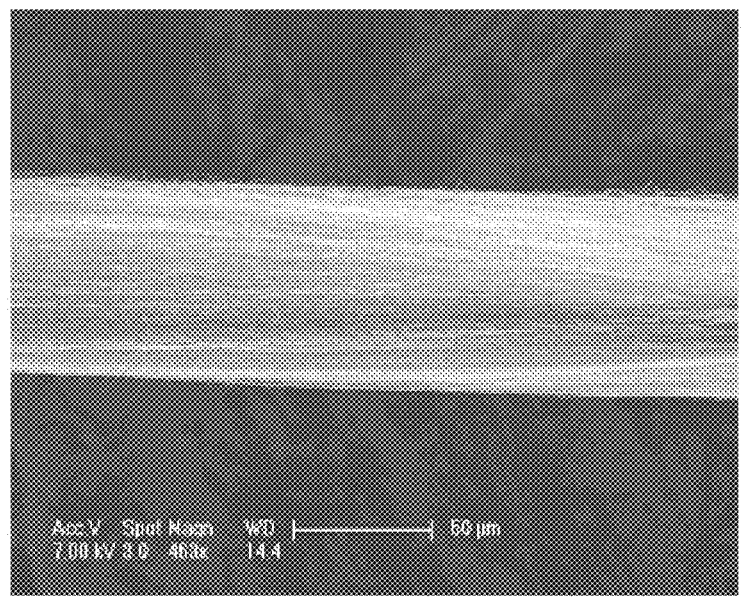
FIG. 4 is an SEM image of an untwisted carbon nanotube wire of one embodiment.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 4, the untwisted carbon nanotube wire includes a plurality of carbon nanotubes substantially oriented along the same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 5:
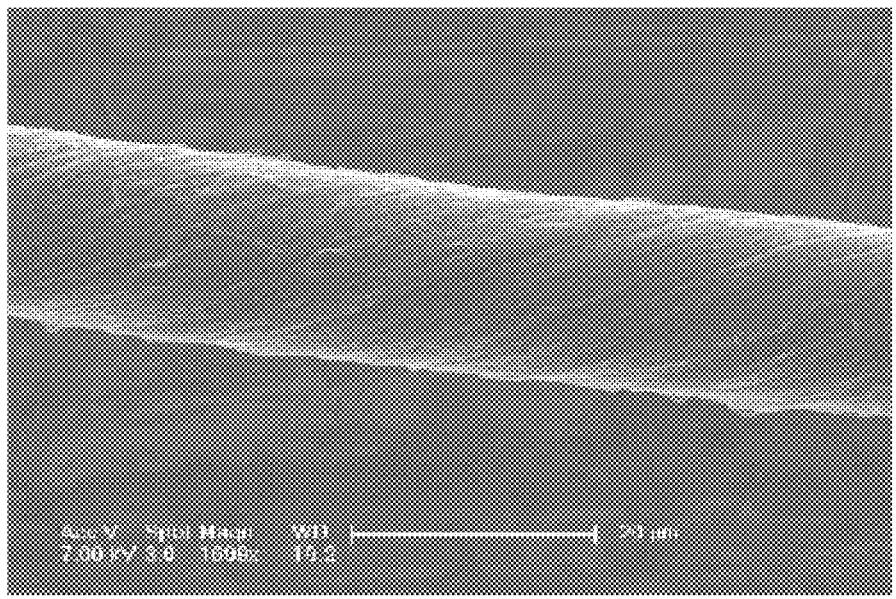
FIG. 5 is an SEM image of a twisted carbon nanotube wire of one embodiment.

The twisted carbon nanotube wire can be formed by twisting a drawn carbon nanotube film using a mechanical force to turn the two ends of the drawn carbon nanotube film in opposite directions. Referring to FIG. 5, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

In step (S11), carbon nanotube composite structure 110 can be made by applying a protective layer 114 on a surface of the carbon nanotube structure 112. The carbon nanotube structure 112 can be suspended in a depositing chamber during depositing the protective layer 114 so that two opposite surfaces of the carbon nanotube structure 112 are coated with the protective layer 114. In some embodiments, each of the plurality of carbon nanotubes is fully enclosed by the protective layer 114. In one embodiment, the carbon nanotube structure 112 is located on a frame so that the middle portion of the carbon nanotube structure 112 is suspended through the through hole of the frame. The frame can be any shape, such as a quadrilateral. The carbon nanotube structure 112 can also be suspended by a metal mesh or metal ring.

The method of depositing the protective layer 114 can be physical vapor deposition (PVD), chemical vapor deposition (CVD), atomic layer deposition, magnetron sputtering, or spraying.

The plurality of openings 116 are formed because of the plurality of apertures of the carbon nanotube structure 112. The plurality of openings 116 and the plurality of apertures have the same shape and different size. The size of the plurality of openings 116 is smaller than that of the plurality of apertures because the protective layer 114 is deposited in the plurality of apertures.

The thickness of the protective layer 114 is in a range from about 3 nanometers to about 50 nanometers. In one embodiment, the thickness of the protective layer 114 is in a range from about 3 nanometers to about 20 nanometers. If the thickness of the protective layer 114 is less than 3 nanometers, the protective layer 114 cannot prevent the carbon nanotubes from being destroyed in following etching process. If the thickness of the protective layer 114 is greater than 50 nanometers, the plurality of apertures may be fully filled by the protective layer 114 and the plurality of openings 116 cannot be obtained.

The material of the protective layer 114 can be metal, metal oxide, metal nitride, metal carbide, metal sulfide, silicon oxide, silicon nitride, or silicon carbide. The metal can be gold, nickel, titanium, iron, aluminum, titanium, chromium, or alloy thereof. The metal oxide can be alumina, magnesium oxide, zinc oxide, or hafnium oxide. The material of the protective layer 114 is not limited above and can be any material as long as the material can be deposited on the carbon nanotube structure 112, would not react with the carbon nanotubes and would not be etched easily in following drying etching process. The protective layer 114 is combined with the carbon nanotube structure 112 by van der Waals attractive force therebetween only.

Figure 6:
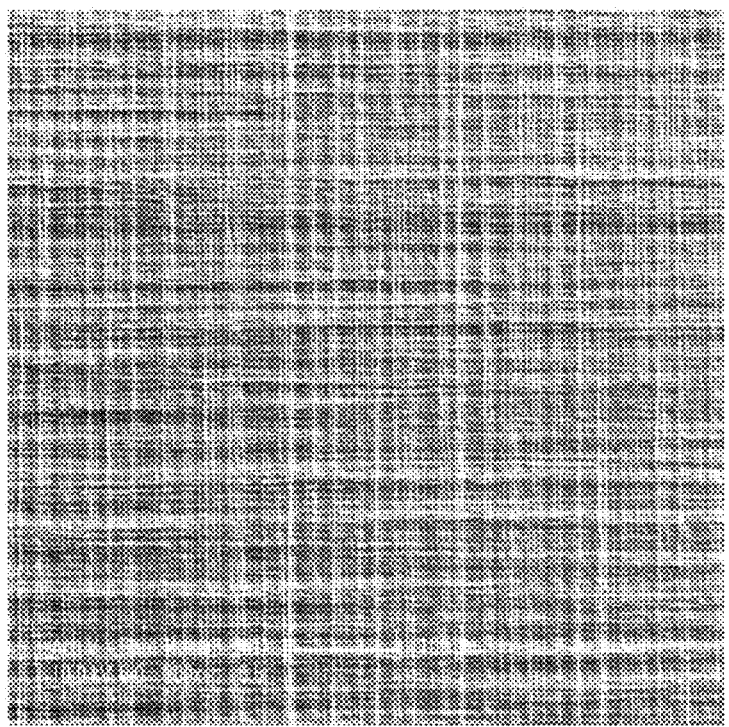
FIG. 6 is an SEM image of a carbon nanotube composite structure with cross-stacked drawn carbon nanotube films of one embodiment.
Figure 7:
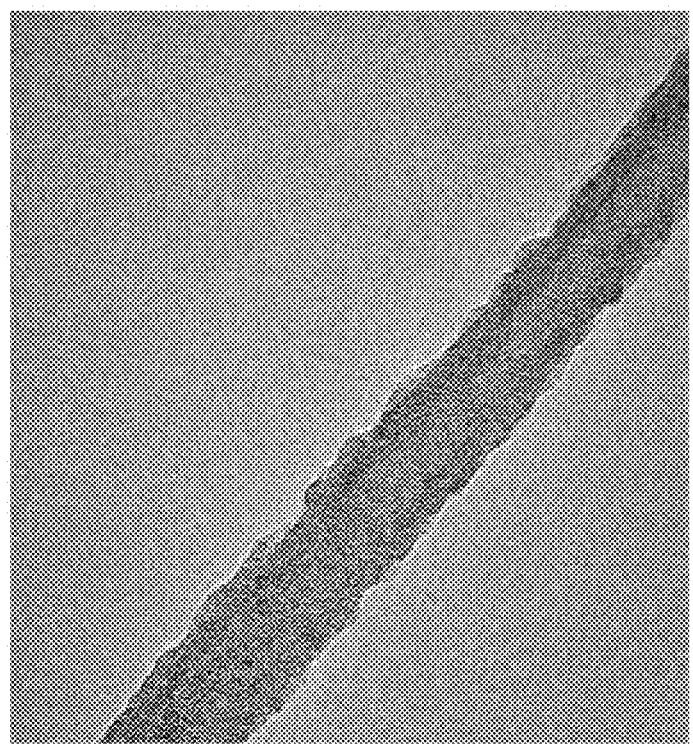
FIG. 7 is a transmission electron microscope (TEM) image of a single carbon nanotube coated by alumina (Al2O3) layer of one embodiment.

As shown in FIG. 6, in one embodiment, an alumina layer of 10 nanometers thickness is deposited on two stacked drawn carbon nanotube films by electron beam evaporation. The aligned direction of the carbon nanotubes between adjacent stacked drawn carbon nanotube films is 90 degrees. As shown in FIG. 7, the alumina layer cover entire surface of each carbon nanotube.

Figure 8:
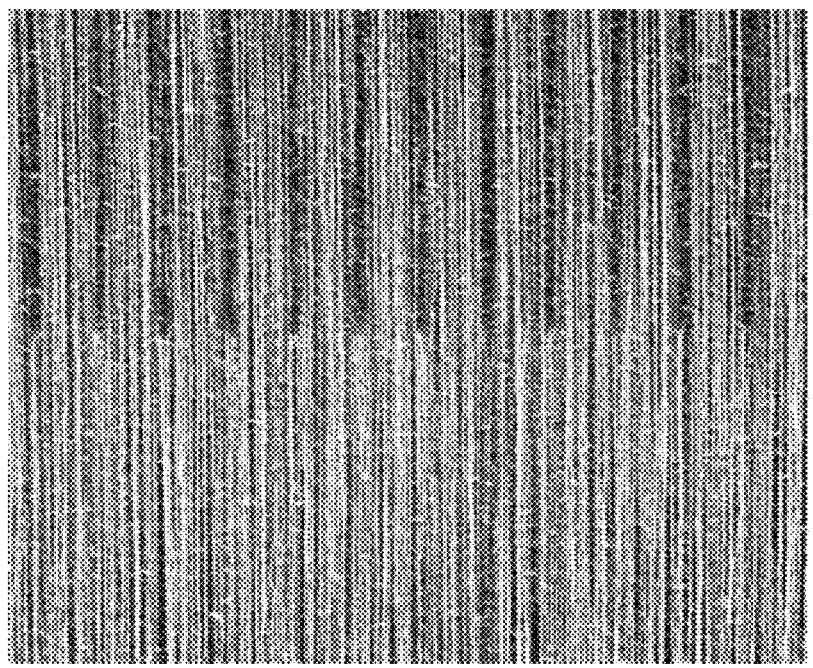
FIG. 8 is a SEM image of a drawn carbon nanotube film after laser treating of one embodiment.

Furthermore, a step of scanning the carbon nanotube structure 112 along the length direction of the carbon nanotubes of the carbon nanotube structure 112 can be performed before the applying the protective layer 114 on the surface of the carbon nanotube structure 112. When the carbon nanotube structure 112 is a drawn carbon nanotube film, the drawn carbon nanotube film is irradiated by a laser device in an atmosphere comprising of oxygen therein. The power density of the laser is greater than $0.053 \times 10^{12}$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 10 micrometers to about 100 micrometers. The laser scanning time is less than 1.8 seconds. In one embodiment, the laser device is carbon dioxide laser device. The power of the laser device is about 30 watts. The wavelength of the laser is about 1.06 micrometers. The diameter of the laser spot is about 20 micrometers to about 80 micrometers. The velocity of the laser movement is less than 10 millimeters per second. The distance between two adjacent scanning paths is in a range from about 0.05 millimeters to about 0.5 millimeters. As shown in top half part of FIG. 8, after laser scanning, the drawn carbon nanotube film includes a plurality of carbon nanotube bundles spaced from each other. After the laser scanning, the drawn carbon nanotube film should still be free-standing. If the laser scanning cut through the drawn carbon nanotube film along laser scanning moving direction, the edges of the drawn carbon nanotube film should be fixed on a frame. When the carbon nanotube structure 112 includes two crossed drawn carbon nanotube films, the two drawn carbon nanotube films should be scanned respectively and then stacked with each other.

In step (S12), the carbon nanotube composite structure 110 can be in direct contact with the surface of the metal layer 102 or suspended above the surface of the metal layer 102 by a support. In one embodiment, the carbon nanotube composite structure 110 is transferred on the surface of the metal layer 102 through the frame above.

Furthermore, the placing the carbon nanotube composite structure 110 on the metal layer 102 comprises solvent treating the substrate 100 with the carbon nanotube composite structure 110 thereon. Because there is air between the carbon nanotube composite structure 110 and the metal layer 102, the solvent treating can remove the air therebetween and allow the carbon nanotube composite structure 110 to be in direct contact and firmly adhered on the surface of the metal layer 102. The solvent treating can be applying a solvent to entire surface of the carbon nanotube composite structure 110 or immersing the entire substrate 100 with the carbon nanotube composite structure 110 in a solvent. The solvent can be water or volatile organic solvent (e.g. ethanol, methanol, acetone, dichloroethane, chloroform, or mixtures thereof). In one embodiment, the ethanol is applied on surface of the carbon nanotube composite structure 110 and then the substrate 100 with the carbon nanotube composite structure 110 is dried by natural air drying.

In the step (S13), the dry etching can be plasma etching or reactive ion etching (RIE). In one embodiment, the dry etching is performed by applying plasma energy on the entire or part surface of the metal layer 102 via a plasma device. The plasma gas can be an inert gas and/or other gases suitable for etching, such as argon (Ar), helium (He), chlorine ($Cl_2$), hydrogen ($H_2$), oxygen ($O_2$), fluorocarbon ($CF_4$), ammonia ($NH_3$), or air.

In one embodiment, the plasma gas is a mixture of oxygen and argon. The power of the plasma device can be in a range from about 20 watts to about 70 watts. The plasma flow of oxygen can be in a range from about 5 standard-state cubic centimeters per minute (sccm) to about 20 sccm. The plasma flow of argon can be in a range from about 15 sccm to about 25 sccm. When the plasma is produced in vacuum, the work pressure of the plasma can be in a range from about 3 Pa to 10 Pa. The time for plasma etching can be in a range from about 10 seconds to about 20 seconds.

In the plasma etching process, the plasma gas would react with the exposed portion of the metal layer 102 and would not react with the protective layer 114, or reaction between the plasma gas and the protective layer 114 is much slower than reaction between the plasma gas and the metal layer 102. Also, the plasma gas would not react with the substrate 100, or reaction between the plasma gas and the substrate 100 is much slower than reaction between the plasma gas and the metal layer 102. The selection relationship of the plasma gas, material of the metal layer 102 and material of the protective layer 114 is shown in Table 1 below.

TABLE 1

| number | metal layer | protective layer | plasma gas |
|---|---|---|---|
| 1 | Al | $SiO_2$ | $Cl_2$ and $BCl_3$ |
| 2 | Au, Cr or Ni | $SiO_2$, $SiN_x$ or $Al_2O_3$ | $O_2$ and $Ar_2$ |
| 3 | Cu | $SiO_2$, $SiN_x$ or $Al_2O_3$ | $SiCl_4$ and $Ar_2$ |

In the etching process, the etching gas reacts with the metal layer 102, but does not react with the protective layer 114 or react with the protective layer 114 at a speed much less than that of the reaction between the etching gas and the metal layer 102. Thus, the exposed portion of the metal layer 102 would be etched gradually and the portion of the metal layer 102 that are shielded by the carbon nanotube composite structure 110 would be remained.

The metal nanowire film 104 and the carbon nanotube composite structure 110 substantially have the same pattern. The pattern of the metal nanowire film 104 depends on the pattern of the carbon nanotube composite structure 110. When the carbon nanotube structure 112 includes a plurality of carbon nanotubes parallel with each other, the metal nanowire film 104 includes a plurality of metal nanowires parallel with each other. When the carbon nanotube structure 112 includes a plurality of carbon nanotubes crossed with each other, the metal nanowire film 104 includes a plurality of metal nanowires crossed with each other. The intersections of the crossed metal nanowires are integral.

The width of the metal nanowires can be less than 100 nanometers, such as less than 50 nanometers. The distance between adjacent two metal nanowires can be in a range from about 10 nanometers to about 300 nanometers, such as from about 20 nanometers to about 100 nanometers. The height of the metal nanowires is the same as the thickness of the metal layer 102. In one embodiment, the width of the metal nanowires is in a range from about 5 nanometers to about 20 nanometers, and the distance between adjacent two metal nanowires is in a range from about 5 nanometers to about 20 nanometers.

In step (S14), the method of removing the carbon nanotube composite structure 110 can be ultrasonic method, or adhesive tape peeling, oxidation. In one embodiment, the substrate 100 with the carbon nanotube composite structure 110 thereon is placed in an N-methyl pyrrolidone solution and ultrasonic treating for several minutes.

Different examples of the metal nanowire films, methods for making the same and test results are described below.

Example 1

In example 1, two drawn carbon nanotube films are stacked with each other and the aligned directions of the carbon nanotubes in the two adjacent drawn carbon nanotube films are perpendicular with each other as shown in FIG. 6. The edges of the two drawn carbon nanotube films are fixed on the metal frame so that the middle parts of the two drawn carbon nanotube films are suspended. The two drawn carbon nanotube films are coated with an alumina layer with a thickness of 10 nanometers, by electron beam evaporation so as to obtain the carbon nanotube composite structure 110. A gold film is deposited on entire surface of the glass plate substrate 100 to form the metal layer 102. The thickness of the gold film is respectively 10 nanometers, 15 nanometers, 20 nanometers, 25 nanometers. The carbon nanotube composite structure 110 is placed on and in direct contact with the gold film through the metal frame. The gold film is dry etched by plasma gas of oxygen and argon to form the metal nanowire film 104. The power of the plasma device is 40 watts. The plasma flow of oxygen is 7 sccm. The plasma flow of argon is 20 sccm. When the plasma is produced in vacuum, the work pressure of the plasma is 5 Pa. The time for plasma etching is 15 seconds. The glass plate is placed in an N-methyl pyrrolidone solution and ultrasonic treating for several minutes to remove the two drawn carbon nanotube films.

Figure 9:
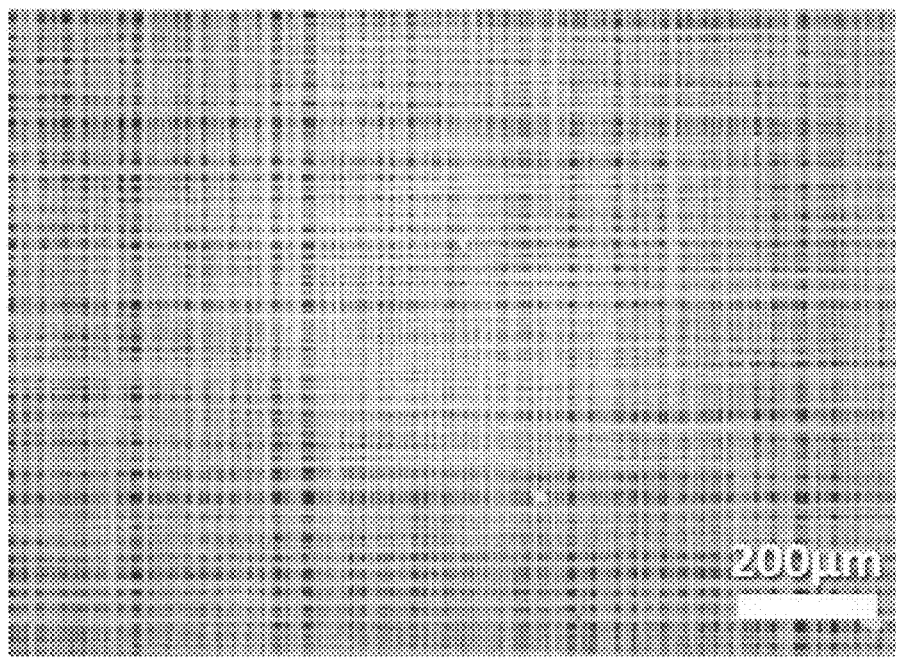
FIGS. 9-10 are SEM images of a metal nanowire film fabricated in example 1.
Figure 10:
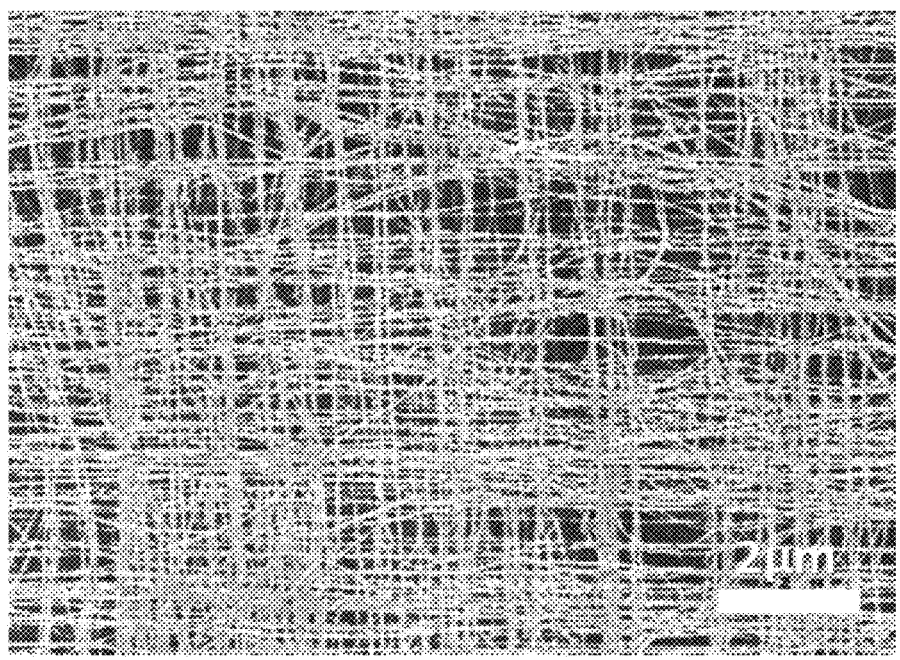
Figure 11:
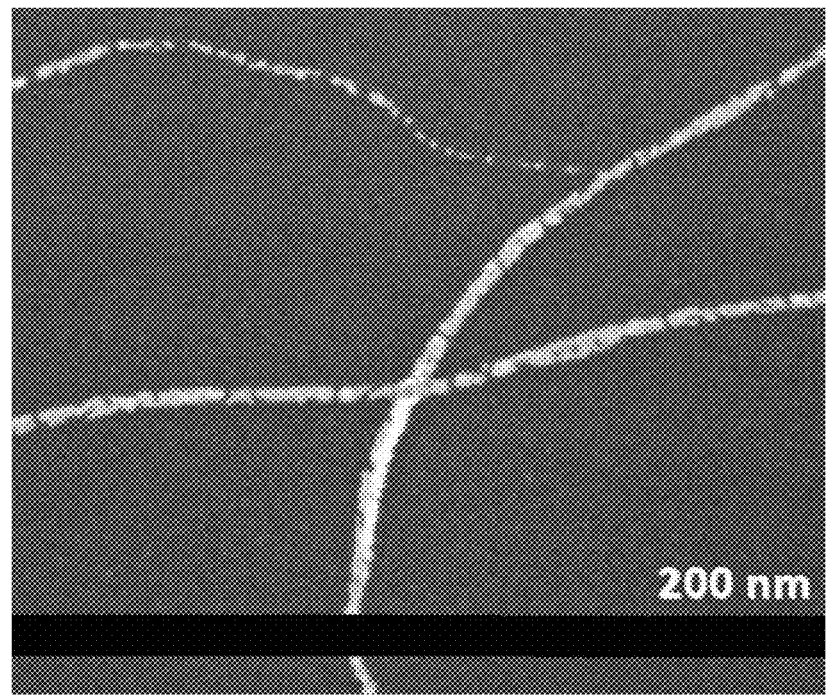
FIG. 11 is a SEM image of metal nanowires of the metal nanowire film fabricated in example 1.
Figure 12:
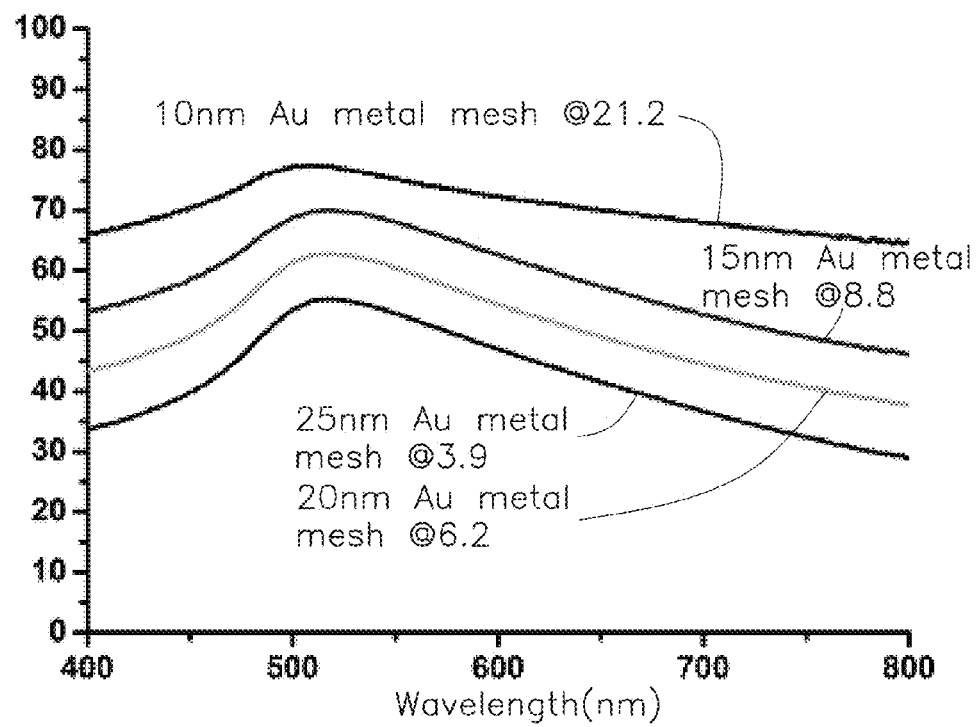
FIG. 12 shows test results of transmittance and sheet resistance of the metal nanowire film fabricated in example 1.

As shown in FIG. 6 and FIG. 9, the metal nanowire film 104 and the carbon nanotube composite structure 110 substantially have the same pattern. As shown in FIGS. 9-11, the metal nanowire film 104 includes a plurality of first metal nanowires substantially arranged along the same first direction and a plurality of second metal nanowires substantially arranged along the same second direction substantially perpendicular with the first direction. The width of the metal nanowires is 20 nanometers. The distance between adjacent two metal nanowires is 50 nanometers. The height of the metal nanowires is the same as the thickness of the gold metal layer 102. As shown in FIG. 12, test results of transmittance for visible light and sheet resistance of the metal nanowire film 104 fabricated in example 1 are given. As the thickness of the gold metal layer 102 increases, namely, the height of the metal nanowires increases, the transmittance for visible light of the metal nanowire film 104 decreases. When the thickness of the gold metal layer 102 is respectively 10 nanometers, 15 nanometers, 20 nanometers, 25 nanometers, the transmittance for visible light of the metal nanowire film 104 is respectively 76%, 68%, 61%, and 53%. As the thickness of the gold metal layer 102 increases, the sheet resistance of the metal nanowire film 104 decreases. When the thickness of the gold metal layer 102 is respectively 10 nanometers, 15 nanometers, 20 nanometers, 25 nanometers, the sheet resistance of the metal nanowire film 104 is respectively 21.2 $\Omega \cdot \square^{-1}$ (Ohms per square), 8.8 $\Omega \cdot \square^{-1}$, 6.2 $\Omega \cdot \square^{-1}$ and 3.9 $\Omega \cdot \square^{-1}$.

Example 2

In example 2, the method for making the metal nanowire film 104 is similar to the method of example 1 except that a single drawn carbon nanotube film is scanned by laser, coated with alumina layer and then fixed on the metal frame to form the carbon nanotube composite structure 110. The scanning path is along the length direction of the carbon nanotubes of the drawn carbon nanotube film. The wavelength of the laser is about 1.06 micrometers. The distance between two adjacent scanning paths is 0.1 millimeters. The thickness of the gold metal layer 102 is 10 nanometers.

Figure 13:
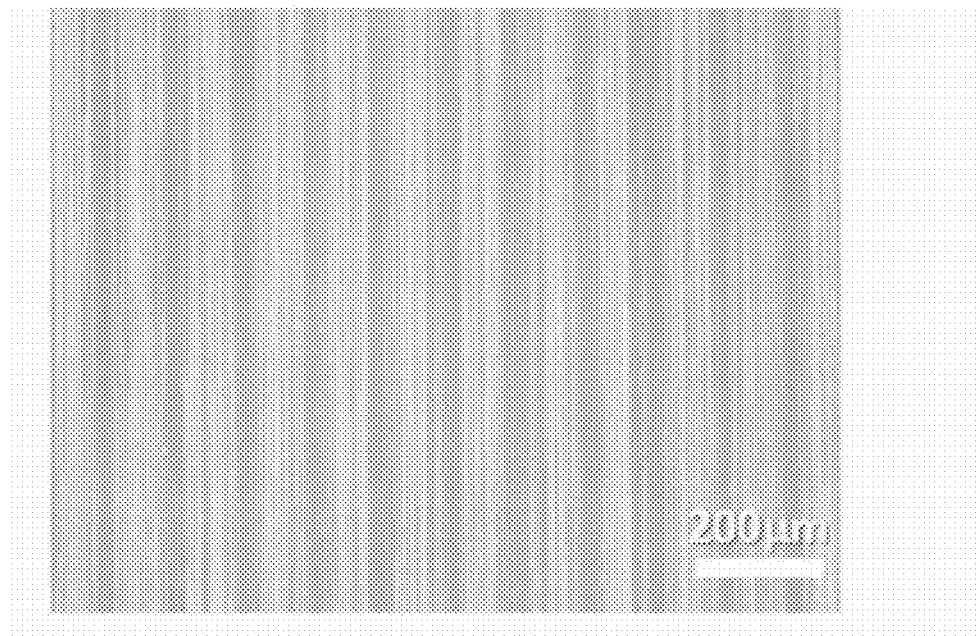
FIG. 13 is a SEM image of a metal nanowire film fabricated in example 2.
Figure 14:
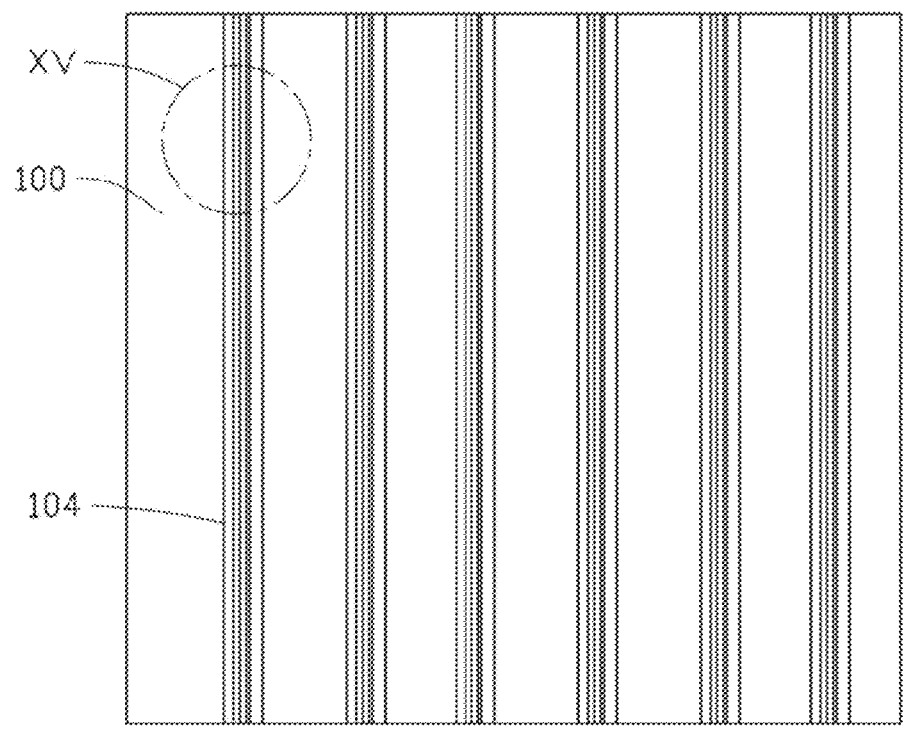
FIG. 14 is a schematic view of the metal nanowire film fabricated in example 2.
Figure 15:
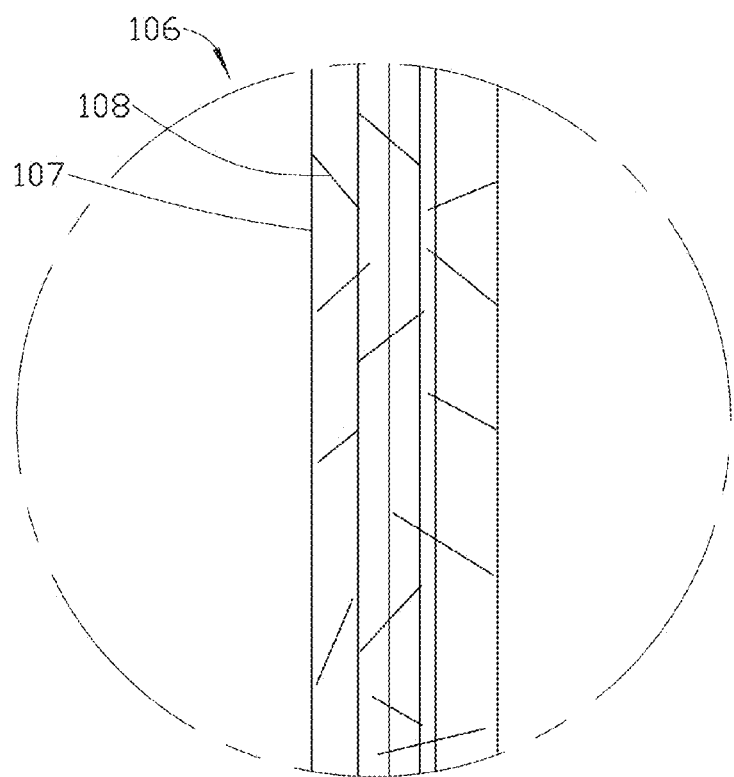
FIG. 15 is an enlarged view of part XV of metal nanowires bundle of the metal nanowire film of FIG. 14.

As shown in FIG. 13-15, the metal nanowire film 104 includes a plurality of metal nanowires bundles 106 parallel with and spaced from each other. Each of the plurality of metal nanowires bundles 106 includes a plurality of first metal nanowires 107 parallel with each other. Each of the plurality of metal nanowires bundles 106 also includes a plurality of randomly arranged second metal nanowires 108 dispersed on the surface of and in contact with adjacent some of the plurality of first metal nanowires 107. The distance between adjacent two first metal nanowires 107 is less than the distance between adjacent two metal nanowires bundles 106. The plurality of first metal nanowires 107 are not absolutely form a direct line and extend along the axial direction, some of them may be curved and in contact with each other. Some variations can occur in the metal nanowire film 104. The distance between adjacent two first metal nanowires 107 can be in a range from about 0 nanometers to about 50 nanometers. The distance between adjacent two metal nanowires bundles 106 can be in a range from about 10 micrometers to about 100 micrometers. The width of the metal nanowires bundles 106 can be in a range from about 50 micrometers to about 500 micrometers. The width of the metal nanowires 107, 108 can be in a range from about 0.5 nanometers to about 50 nanometers. The distance between adjacent two metal nanowires bundles 106 depends on the diameter of the laser spot. The width of the metal nanowires bundles 106 depends on the distance between two adjacent laser scanning paths. The width of the metal nanowires 107, 108 depends on the diameter of the carbon nanotubes of the drawn carbon nanotube film. The height of the metal nanowires 107, 108 depends on the thickness of the gold metal layer 102.

Example 3

In example 3, the method for making the metal nanowire film 104 is similar to the method of example 1 except that two drawn carbon nanotube films are scanned by laser, coated with alumina layer and then fixed on the metal frame to form the carbon nanotube composite structure 110. The scanning path is along the length direction of the carbon nanotubes of each of the drawn carbon nanotube films. The wavelength of the laser is about 1.06 micrometers. The distance between two adjacent scanning paths is 0.1 millimeters. The thickness of the gold metal layer 102 is respectively 10 nanometers, 15 nanometers, 20 nanometers, 25 nanometers.

Figure 16:
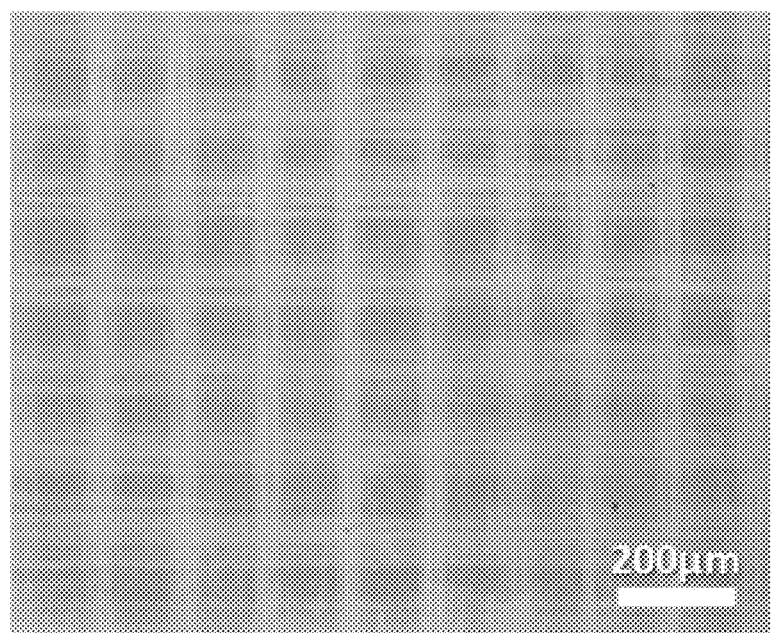
FIG. 16 is a SEM image of a metal nanowire film fabricated in example 3.
Figure 17:
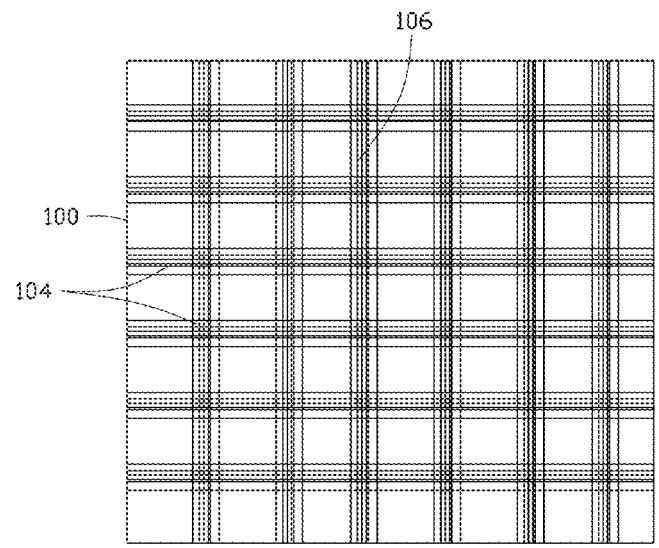
FIG. 17 is a schematic view of the metal nanowire film fabricated in example 3.
Figure 18:
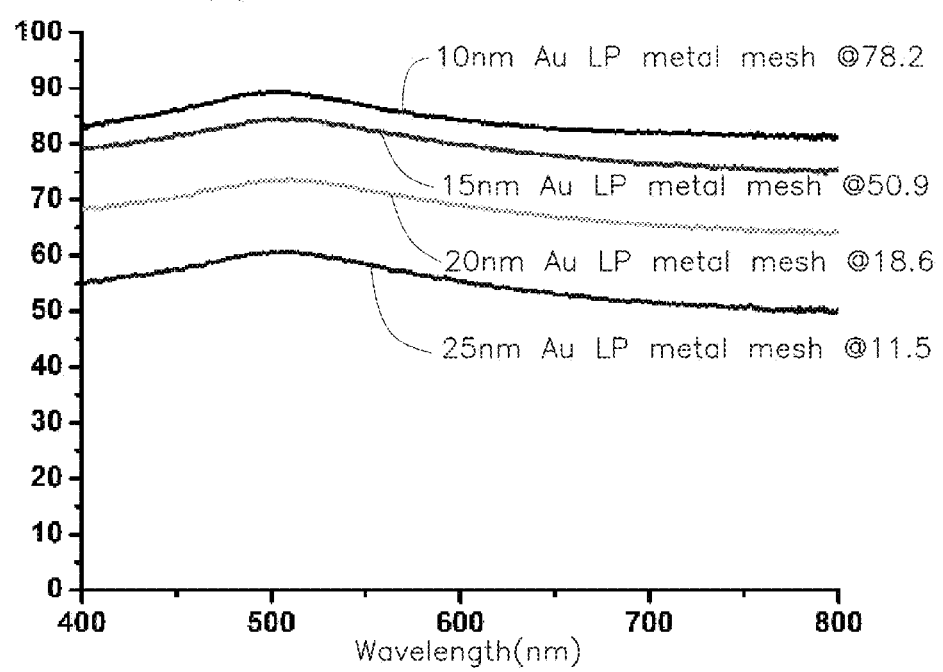
FIG. 18 shows test results of transmittance and sheet resistance of the metal nanowire film fabricated in example 3.

As shown in FIGS. 16-17, the metal nanowire film 104 includes a plurality of first metal nanowires bundles 106 parallel with, spaced from each other and extend along the same first direction a plurality of second metal nanowires bundles 106 parallel with, spaced from each other and extend along the same second direction substantially perpendicular with the first direction. The metal nanowire film 104 is a metal mesh. As shown in FIG. 18, when the thickness of the gold metal layer 102 is respectively 10 nanometers, 15 nanometers, 20 nanometers, 25 nanometers, the transmittance for visible light of the metal nanowire film 104 is respectively 87.5%, 82.6%, 71.7%, and 59.4%, the sheet resistance of the metal nanowire film 104 is respectively 78.2 $\Omega\cdot\square^{-1}$, 50.9 $\Omega\cdot\square^{-1}$, 18.6 $\Omega\cdot\square^{-1}$ and 11.5 $\Omega\cdot\square^{-1}$. Compare with FIG. 13, it is shown that after the laser scanning, when the thickness of the gold metal layer 102 is the same, the transmittance for visible light of the metal nanowire film 104 increases, and the sheet resistance of the metal nanowire film 104 also increases.

Example 4

Figure 19:
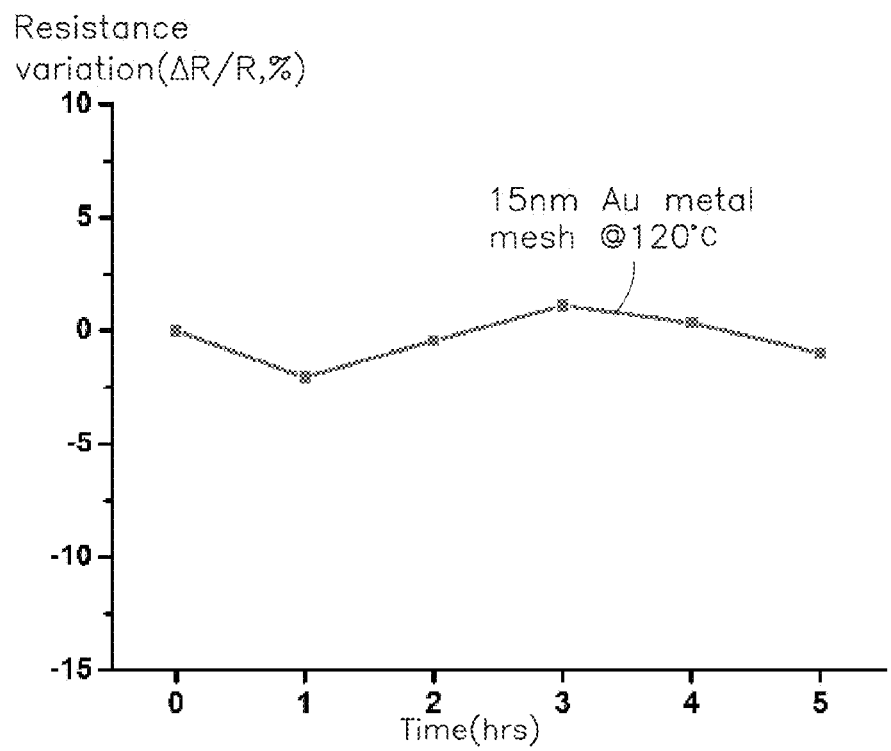
FIG. 19 shows a relationship of sheet resistance under heating and time of the metal nanowire film fabricated in example 4.
Figure 20:
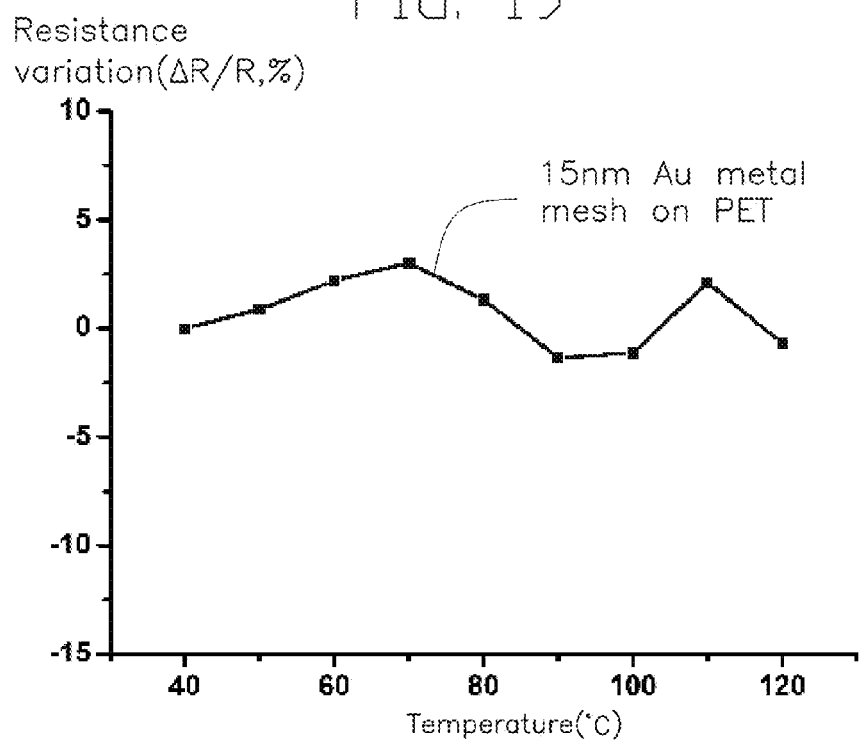
FIG. 20 shows a relationship of sheet resistance under heating and temperature of the metal nanowire film fabricated in example 4.

In example 4, the method for making the metal nanowire film 104 is similar to the method of example 1 except that the substrate 100 is a PET film. The thickness of the gold metal layer 102 is 15 nanometers. As shown in FIG. 19, the sheet resistance under 120° C. of the metal nanowire film 104 is substantially stable and maintains as 50 $\Omega\cdot\square^{-1}$. As shown in FIG. 20, the sheet resistance of the metal nanowire film 104 is substantially stable and unchanged under the temperature from about 40° C. to about 120° C.

Example 5

Figure 21:
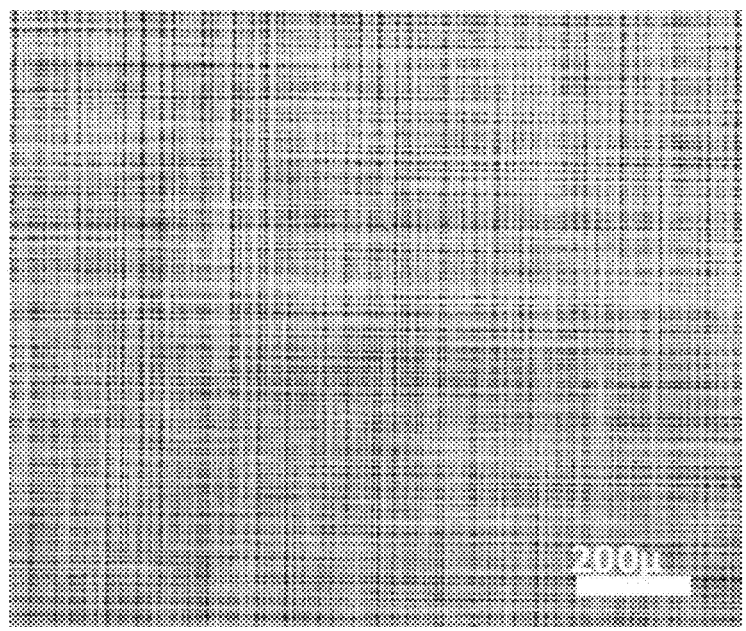
FIG. 21 is a SEM image of a metal nanowire film fabricated in example 5.
Figure 22:
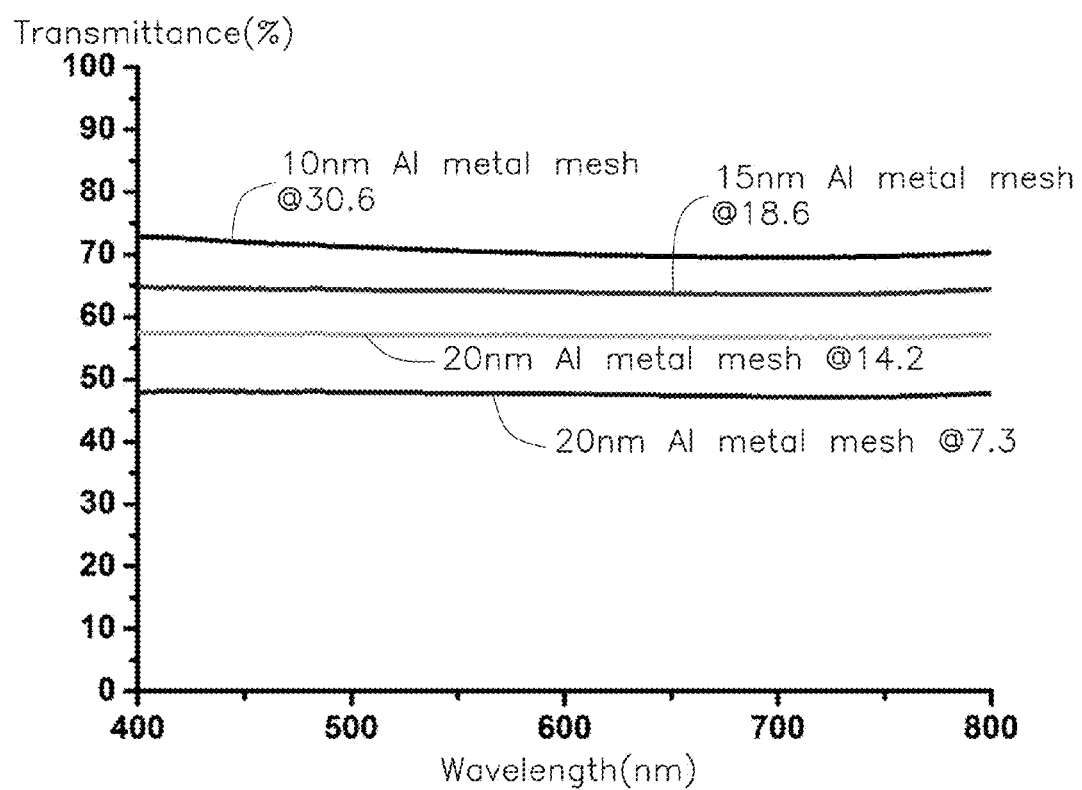
FIG. 22 shows test results of transmittance and sheet resistance of the metal nanowire film fabricated in example 5.

In example 5, the method for making the metal nanowire film 104 is similar to the method of example 1 except that the metal layer 102 is an aluminum film. The thickness of the aluminum metal layer 102 is respectively 10 nanometers, 15 nanometers, 20 nanometers, 25 nanometers. The SEM image of the aluminum metal nanowire film 104 is shown in FIG. 21. The test results of transmittance and sheet resistance of the aluminum metal nanowire film 104 is shown in FIG. 22.

Example 6

Figure 23:
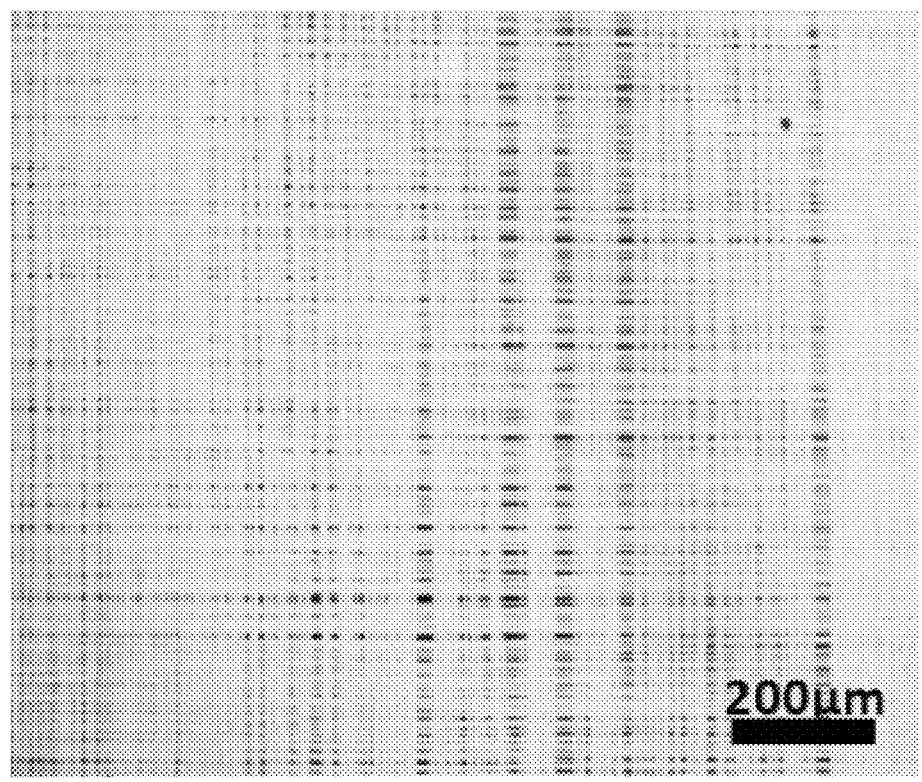
FIG. 23 is a SEM image of a metal nanowire film fabricated in example 6.
Figure 24:
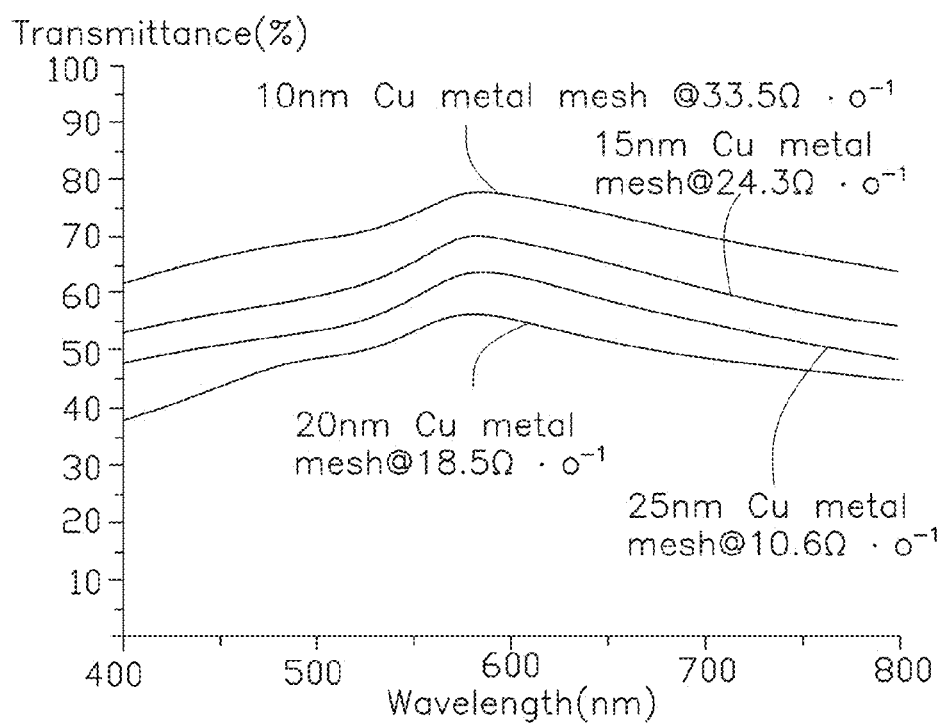
FIG. 24 shows test results of transmittance and sheet resistance of the metal nanowire film fabricated in example 6.

In example 6, the method for making the metal nanowire film 104 is similar to the method of example 1 except that the metal layer 102 is a copper film. The thickness of the copper metal layer 102 is respectively 10 nanometers, 15 nanometers, 20 nanometers, 25 nanometers. The SEM image of the copper metal nanowire film 104 is shown in FIG. 23. The test results of transmittance and sheet resistance of the copper metal nanowire film 104 is shown in FIG. 24.

Example 7

Figure 25:
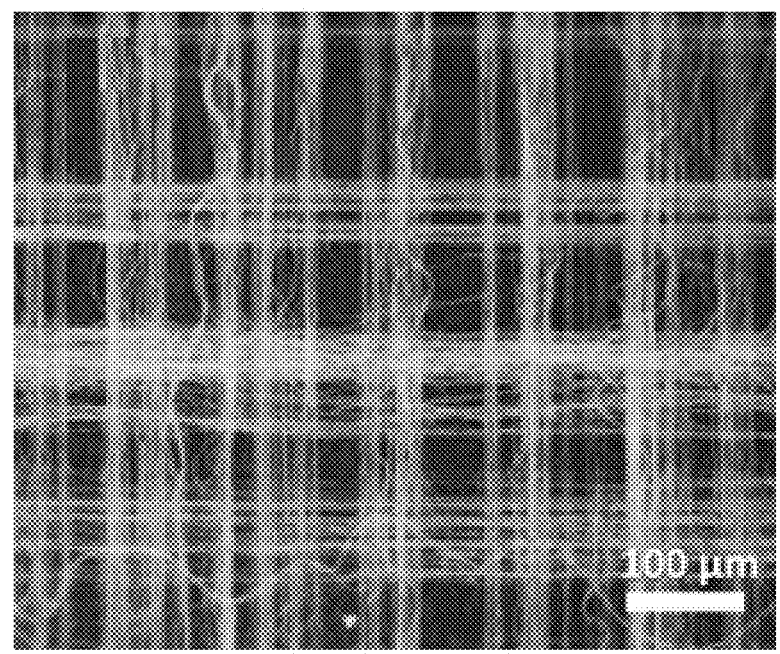
FIG. 25 is a SEM image of a metal nanowire film fabricated in example 7.
Figure 26:
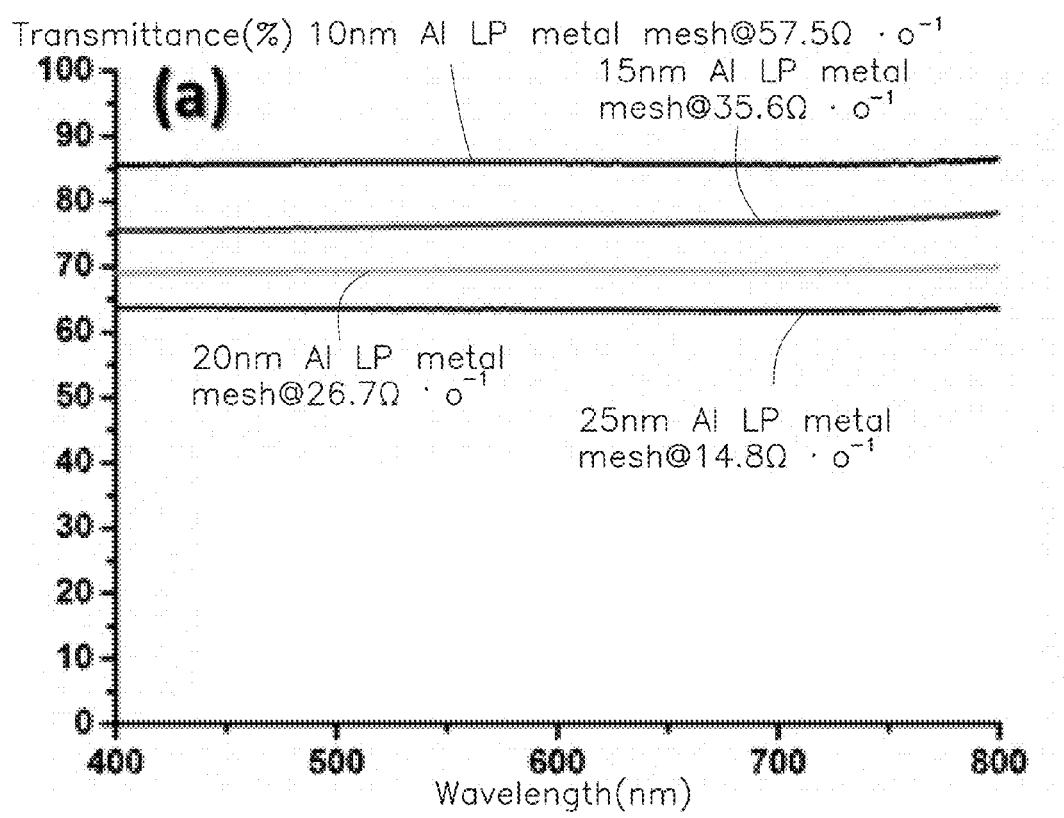
FIG. 26 shows test results of transmittance and sheet resistance of the metal nanowire film fabricated in example 7.

In example 7, the method for making the metal nanowire film 104 is similar to the method of example 3 except that the metal layer 102 is an aluminum film. The thickness of the aluminum metal layer 102 is respectively 10 nanometers, 15 nanometers, 20 nanometers, 25 nanometers. The SEM image of the aluminum metal nanowire film 104 is shown in FIG. 25. The test results of transmittance and sheet resistance of the aluminum metal nanowire film 104 is shown in FIG. 26.

Example 8

Figure 27:
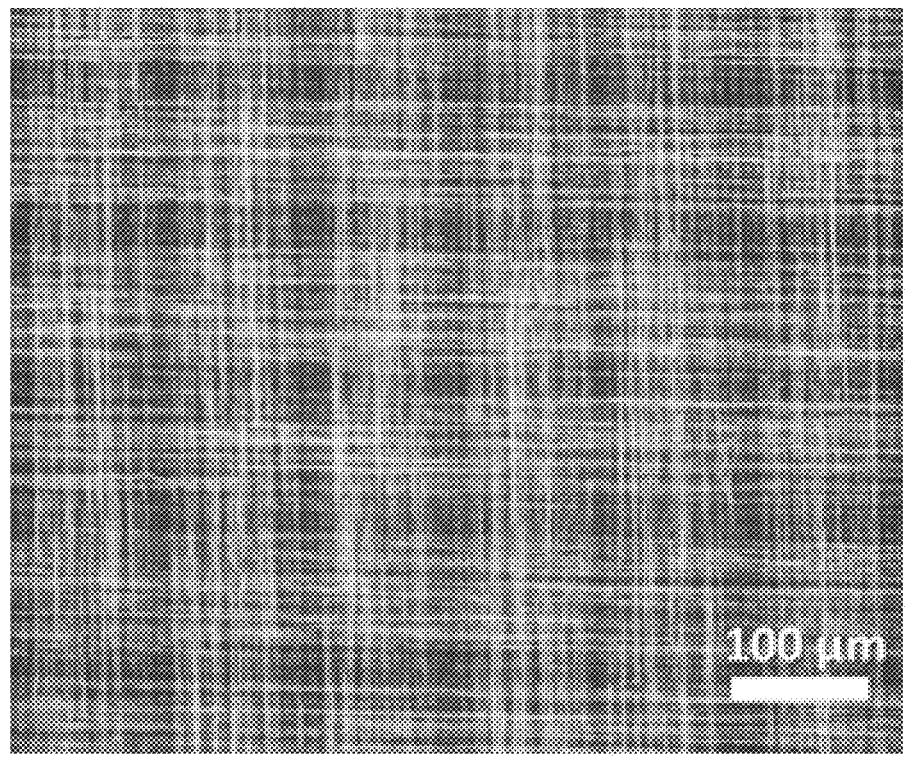
FIG. 27 is a SEM image of a metal nanowire film fabricated in example 8.
Figure 28:
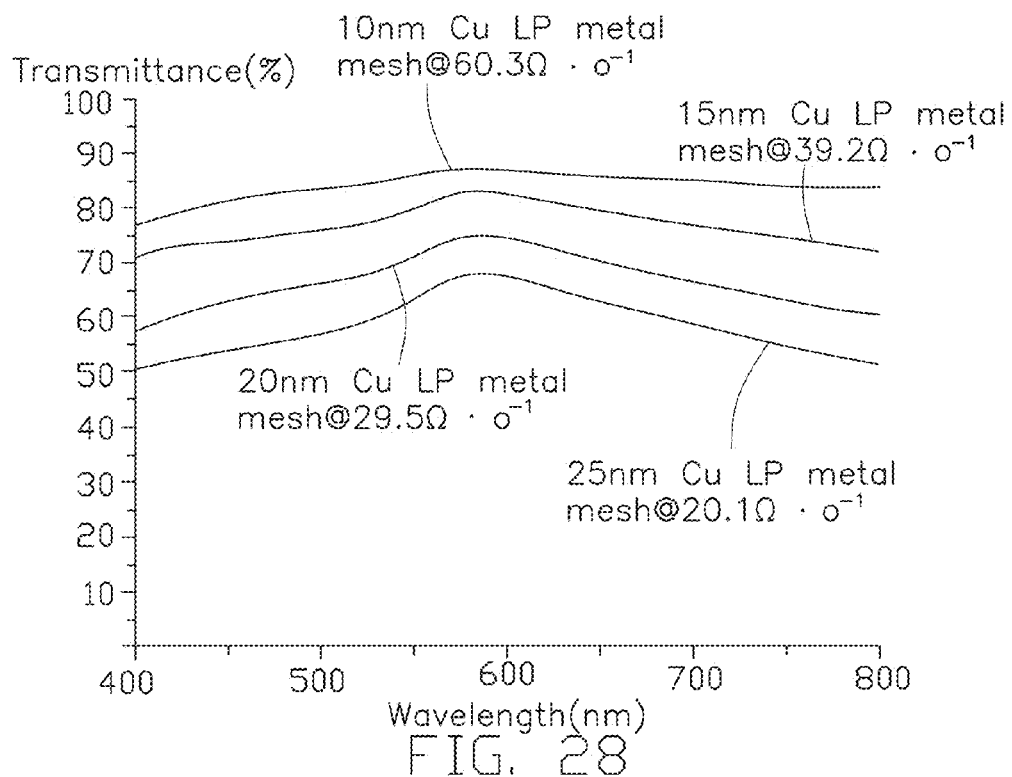
FIG. 28 shows test results of transmittance and sheet resistance of the metal nanowire film fabricated in example 8.

In example 8, the method for making the metal nanowire film 104 is similar to the method of example 3 except that the metal layer 102 is a copper film. The thickness of the copper metal layer 102 is respectively 10 nanometers, 15 nanometers, 20 nanometers, 25 nanometers. The SEM image of the copper metal nanowire film 104 is shown in FIG. 27. The test results of transmittance and sheet resistance of the copper metal nanowire film 104 is shown in FIG. 28.

Example 9

Figure 29:
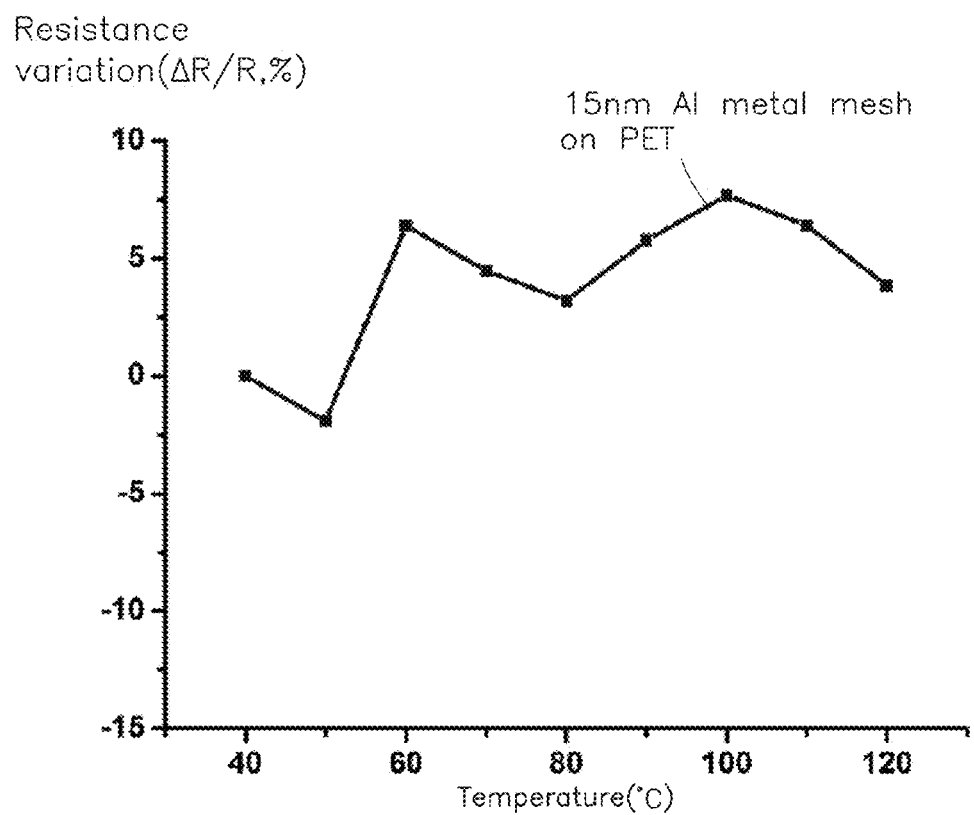
FIG. 29 shows a relationship of sheet resistance under heating and temperature of the metal nanowire film fabricated in example 9.
Figure 30:
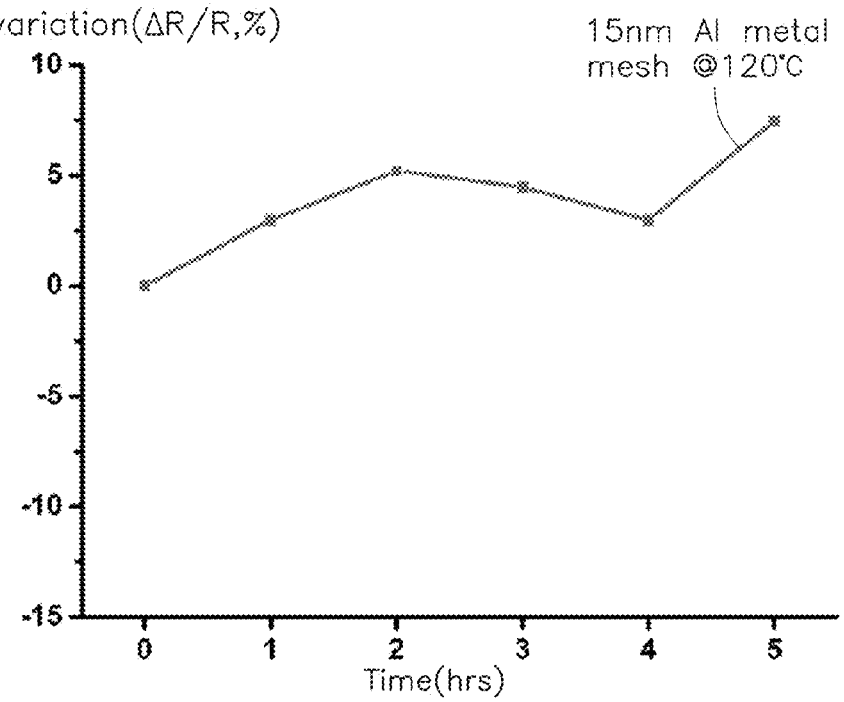
FIG. 30 shows a relationship of sheet resistance under heating and time of the metal nanowire film fabricated in example 9.

In example 9, the method for making the metal nanowire film 104 is similar to the method of example 4 except that the metal layer 102 is an aluminum film. FIG. 29 shows a relationship of sheet resistance under heating and temperature of the metal nanowire film 104 fabricated in example 9. FIG. 30 shows a relationship of sheet resistance under heating and time of the metal nanowire film 104 fabricated in example 9.

Example 10

Figure 31:
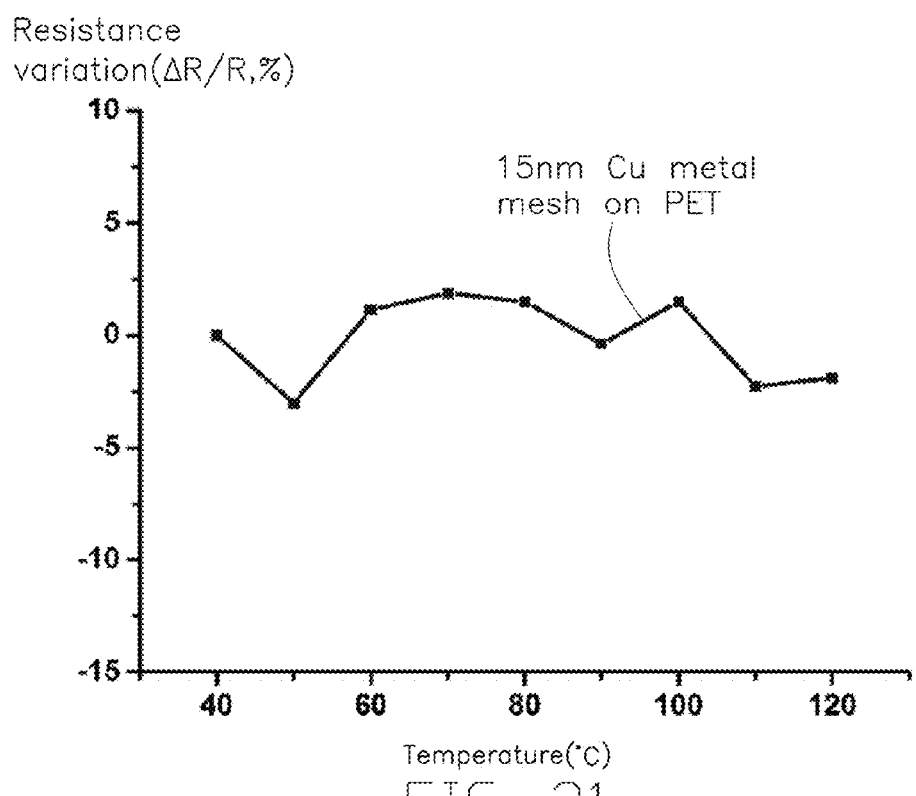
FIG. 31 shows a relationship of sheet resistance under heating and temperature of the metal nanowire film fabricated in example 10.
Figure 32:
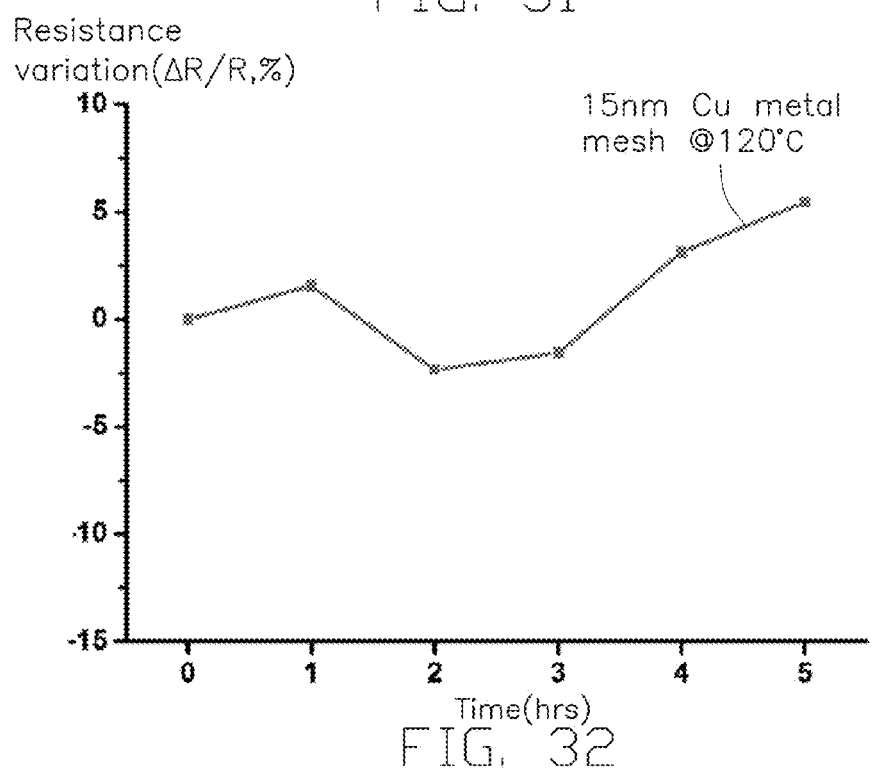
FIG. 32 shows a relationship of sheet resistance under heating and time of the metal nanowire film fabricated in example 10.

In example 10, the method for making the metal nanowire film 104 is similar to the method of example 4 except that the metal layer 102 is a copper film. FIG. 31 shows a relationship of sheet resistance under heating and temperature of the metal nanowire film 104 fabricated in example 10. FIG. 32 shows a relationship of sheet resistance under heating and time of the metal nanowire film 104 fabricated in example 10.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A metal nanowire film, comprising:
a substrate having a surface;
a plurality of first metal nanowire bundles located on and in direct contact the surface of the substrate; the plurality of first metal nanowire bundles are parallel with and spaced from each other; each of the plurality of first metal nanowire bundles comprises a plurality of first metal nanowires parallel to each other and parallel with the surface of the substrate; wherein a first distance between adjacent first metal nanowires is less than a second distance between adjacent first metal nanowire bundles; and
a plurality of second metal nanowire bundles located on the substrate and crossed with the plurality of first metal nanowire bundles; the plurality of second metal nanowire bundles are parallel with and spaced from each other; each of the plurality of second metal nanowire bundles comprises a plurality of second metal nanowires parallel with each other; a third distance between adjacent second metal nanowires is less than a fourth distance between adjacent second metal nanowire bundles.

2. The metal nanowire film of claim 1, wherein the first distance is in a range from about 0 nanometers to about 50 nanometers; and the second distance is in a range from about 10 micrometers to about 100 micrometers.

3. The metal nanowire film of claim 1, wherein a first width of each of the plurality of first metal nanowire bundles is in a range from about 50 micrometers to about 500 micrometers; and a second width of each of the plurality of first metal nanowires is in a range from about 0.5 nanometers to about 50 nanometers.

4. The metal nanowire film of claim 1, wherein intersections of the plurality of second metal nanowire bundles and the plurality of first metal nanowire bundles are integral.

5. The metal nanowire film of claim 1, wherein the plurality of second metal nanowire bundles and the plurality of first metal nanowire bundles are perpendicular with each other.

6. The metal nanowire film of claim 1, wherein a material of the plurality of first metal nanowires is selected from the group consisting of gold, silver, copper, iron, aluminum, nickel and chromium.

7. The metal nanowire film of claim 1, wherein the substrate comprises rigid materials selected from the group consisting of silicon, ceramic, glass, quartz, diamond, metal oxide and plastic.

8. The metal nanowire film of claim 1, wherein the substrate comprises flexible materials selected from the group consisting of polycarbonate, polymethyl methacrylate acrylic, polyethylene terephthalate, polyether polysulfones, polyvinyl polychloride, benzocyclobutenes, polyesters, polyimide, polyethylene, acrylonitrile-butadiene-styrene copolymer, polyamide, polybutylene terephthalate, and acrylic resins.

9. The metal nanowire film of claim 4, wherein the plurality of second metal nanowires bundles and the plurality of first metal nanowires bundles are made by following steps:
applying a metal layer on the surface of the substrate, wherein the metal layer has a metal layer surface spaced from the surface;
providing a carbon nanotube composite structure, wherein the carbon nanotube composite structure defines a plurality of openings and comprises a carbon nanotube structure and a protective layer, coated on the carbon nanotube structure; the carbon nanotube structure comprises a first carbon nanotube film and a second carbon nanotube film stacked with each other; the first carbon nanotube film comprises a plurality of first carbon nanotubes that are joined end-to-end by van der Waals attractive force therebetween and substantially arranged along the same first direction and scanned by laser along the same first direction; and the second carbon nanotube film comprises a plurality of second carbon nanotubes that are joined end-to-end by van der Waals attractive force therebetween and substantially arranged along the same second direction and scanned by laser along the same second direction; and the second direction is different from the first direction;
placing the carbon nanotube composite structure on the metal layer surface, wherein parts of the metal layer are exposed by the plurality of openings;
dry etching the metal layer using the carbon nanotube composite structure as a mask; and
removing the carbon nanotube composite structure.

* * * * *